(12) United States Patent
Maiellaro et al.

(10) Patent No.: US 11,860,223 B2
(45) Date of Patent: Jan. 2, 2024

(54) METHOD OF GENERATING SELF-TEST SIGNALS, CORRESPONDING CIRCUIT AND APPARATUS

(71) Applicant: STMICROELECTRONICS S.r.l., Agrate Brianza (IT)

(72) Inventors: Giorgio Maiellaro, Gravina di Catania (IT); Angelo Scuderi, Catania (IT); Angela Bruno, Catania (IT); Salvatore Scaccianoce, Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/479,510

(22) Filed: Sep. 20, 2021

(65) Prior Publication Data
US 2022/0003814 A1  Jan. 6, 2022

Related U.S. Application Data (63) Continuation of application No. 15/691,381, filed on Aug. 30, 2017, now Pat. No. 11,150,294.

(30) Foreign Application Priority Data

Jan. 3, 2017  (IT) .......................... 102017000000392

(51) Int. Cl.
*G01R 31/28* (2006.01)
*G01S 7/40* (2006.01)

(52) U.S. Cl.
CPC ..... *G01R 31/2884* (2013.01); *G01R 31/2832* (2013.01); *G01S 7/4056* (2013.01); *G01S 7/4069* (2021.05)

(58) Field of Classification Search
None
See application file for complete search history.

(56) References Cited

U.S. PATENT DOCUMENTS 5,790,942 A * 8/1998 Le Corre ............. H03C 3/0966
                                                    455/119
6,091,343 A    7/2000 Dykema et al.
(Continued)

FOREIGN PATENT DOCUMENTS

CN   105790760 A    7/2016
EP   2 336 803 A1   6/2011

OTHER PUBLICATIONS

Dąbrowski et al., "Built-in Loopback Test for IC RF Transceivers," *IEEE Transactions on Very Large Scale Integration (VLSI) Systems* 18(6):933-946, 2010.
(Continued)

*Primary Examiner* — Nasima Monsur
(74) *Attorney, Agent, or Firm* — SEED INTELLECTUAL PROPERTY LAW GROUP LLP (57) ABSTRACT

A radio-frequency receiver includes built-in-self-test (BIST) circuitry which generates a self-test signal. A local oscillator signal is divided. A self-test oscillation signal is generated, based, at least in part, on the frequency-divided local oscillation signal. The self-test signal is generated based on the self-test oscillation signal. The BIST circuitry includes a divider, which divides the self-test oscillation signal. The frequency-divided local oscillation signal and the divided self-test oscillation signal are used to perform one or more of generating the self-test oscillation signal and controlling the generation of the self-test oscillation signal. The radio-frequency receiver may be an automotive radar receiver.

17 Claims, 6 Drawing Sheets

(56) References Cited

U.S. PATENT DOCUMENTS

| | | | |
|---|---|---|---|
| 6,728,521 | B1 | 4/2004 | Sirit et al. |
| 9,866,222 | B2 | 1/2018 | Trotta et al. |
| 11,150,294 | B2 * | 10/2021 | Maiellaro .......... G01R 31/2832 |
| 2007/0259643 | A1 | 11/2007 | Wu |
| 2011/0163815 | A1 | 7/2011 | Bellaouar et al. |
| 2014/0187170 | A1 | 7/2014 | Forstner |
| 2014/0266345 | A1 | 9/2014 | Matsumura |
| 2016/0077196 | A1 | 3/2016 | Dehlink et al. |
| 2016/0204784 | A1 * | 7/2016 | Trotta ................ H03L 7/099 342/368 |
| 2016/0269131 | A1 | 9/2016 | Matsumura |
| 2017/0141857 | A1 * | 5/2017 | Casagrande .......... H03L 7/0891 |

OTHER PUBLICATIONS

Italian Search Report and Written Opinion, dated Sep. 12, 2017, for Italian Application No. 201700000392, 8 pages.

Schnabel et al., "An ISO 26262 compliant built-in self-test for 77 GHz automotive radar sensors," *Proceedings of the 10$^{th}$ European Radar Conference*, Nuremberg, Germany, Oct. 9-11, 2013, pp. 216-219.

Stove, "Linear FMCW radar techniques," *IEE Proceedings-F* 139(5):343-350, 1992.

* cited by examiner

METHOD OF GENERATING SELF-TEST SIGNALS, CORRESPONDING CIRCUIT AND APPARATUS

BACKGROUND

Technical Field

The present disclosure relates to generating test signals, e.g., radio-frequency (RF) test signals, for use, for example, in Built-In-Self-Test (BIST) calibration and safety monitoring of integrated circuits (ICs), such as in automotive radar sensor applications.

Description of the Related Art

Common automotive radar sensors exploit Frequency Modulation Continuous Wave (FMCW) modulation schemes for target detection. Exemplary solutions of that kind are disclosed, e.g., in A. G. Stove, "Linear FMCW radar techniques", IEE Proceedings-F, Radar and Signal Processing, vol. 139, pp. 343-350, October 1992.

Different frequency modulated waveforms (e.g., sawtooth, triangle, sinusoidal) may be used during the transmission phase. The received signal is a shifted replica in frequency and time of the transmitted signal.

By using, e.g., a triangular frequency-modulated waveform, the radar sensor is able to simultaneously determine target distance (range) and its relative velocity by processing the base band IF signal. Multi-input multi-output systems may include several transmitters and several receivers generating different IF signals, which allow also angular information to be calculated thanks to triangulation techniques. Intermediate frequency (IF) signals may be processed, e.g., by a radar system microcontroller.

Accuracy in target detection in, e.g., a complex multi-target environment is facilitated by Integrated Circuit IC performance being stable versus temperature and aging, e.g., in terms of transmitted power, receiver conversion gain, I/Q phase, IF filter frequency response, and so on.

The capability for, e.g., a microcontroller or digital signal processing unit to collect IC performance deviations during running and life time of the radar sensor is thus a desirable feature.

Accurate IC performance may be facilitated by Built-In-Self-Test (BIST) and calibration functionality.

Documents such as R. Schnabel et al.: "An ISO 26262 compliant built-in self-test for 77 GHz automotive radar sensors", Proceedings of the 10th European Radar Conference, 9-11 Oct. 2013, Nuremberg, Germany are exemplary of activity related to new functional safety standards for, e.g., automotive products (standard ISO26262 being a case in point) which may involve using additional circuitry or, e.g., reliable monitoring of proper functionality and critical failures detection in the IC.

Particularly in safety-relevant automotive products, integration of hardware failure diagnosis may play a role in fulfilling safety requirements, e.g., according to the ISO 26262 standard. Recently developed automotive radar sensor ICs may thus include additional integrated circuitry for run-time calibration procedures and reliable monitoring of critical hardware faults.

An architecture used for Built-In-Self-Test (BIST) systems in RF transceiver may be based on a loop-back concept.

In such an approach, as documented, e.g., in Jerzy J. Dąbrowski et al.: "Built-in Loopback Test for IC RF Transceivers", IEEE Transactions on Very Large Scale Integration (VLSI) Systems, vol. 18, NO. 6, June 2010, a test signal from the transmitter is injected into a receiver input by means of additional circuit building blocks. Specifically, the BIST circuit disclosed in that document includes a mixer and an attenuator, with the test signal down-converted to the IF signal. The signal injected into the receiver input is a DSB (Double-Side Band) signal, which is not suitable for use in calibrating a radar sensor IC.

BRIEF SUMMARY

In an embodiment, a method of generating a self-test signal for a receiver of radiofrequency signals wherein a local oscillator signal is generated for mixing with a reception signal, comprises: applying frequency division to said local oscillator signal to produce a frequency-divided signal, providing a signal generator for generating said self-test signal, and generating said self-test signal by operating said signal generator with operation of said signal generator monitored or controlled via said frequency-divided signal. In an embodiment, the method includes: generating said local oscillator signal via a first oscillator, generating via a second oscillator a further oscillating signal to provide said self-test signal with operation of said second oscillator monitored or controlled via said frequency-divided signal. In an embodiment, the method includes: setting the frequencies of said first oscillator and said second oscillator with a common coarse tuning signal, and finely tuning the frequencies of said first oscillator and said second oscillator with respective fine tuning signals. In an embodiment, at least one of said fine tuning signals is produced using a digital-to-analog converter. In an embodiment, the method includes selectively tuning the frequency of said second oscillator to produce chirp modulation of said self-test signal. In an embodiment, the method includes: applying frequency division to said local oscillator signal and said further oscillating signal to produce respective frequency-divided oscillating signals, and monitoring the frequency of said further oscillating signal by comparing said respective frequency-divided oscillating signals. In an embodiment, the method includes: providing a PLL circuit with an output oscillator for generating said self-test signal, an input comparator and a loop divider between said output oscillator and said input comparator, and supplying to said input comparator of the PLL circuit said frequency-divided signal. In an embodiment, the method includes supplying to said input comparator of the PLL circuit a time delayed version of said frequency-divided signal. In an embodiment, the method includes selectively varying the division factor of said loop divider to vary the frequency of said self-test signal.

In an embodiment, a circuit comprises: a local oscillator that generates a local oscillator signal, at least one mixer that mixes said local oscillator signal with a reception signal, at least one frequency divider that applies to said local oscillator signal frequency division to produce a frequency-divided signal, and at least one further oscillator, wherein the circuit, in operation, generates said self-test signal with operation of said signal generator monitored or controlled via said frequency-divided signal. In an embodiment, the circuit includes a Microwave/Millimeter-wave Monolithic Integrated Circuit on a Printed Circuit Board, the circuit including at least one coupler for coupling said self-test signal to a receiver input, wherein said at least one coupler: is hosted on said Printed Circuit Board externally of said Microwave/Millimeter-wave Monolithic Integrated Circuit; or is hosted internally of said Microwave/Millimeter-wave Monolithic Integrated Circuit. In an embodiment, the circuit is included in a receiver of radio frequency signals. The receiver of claim 10, including a radar receiver for automotive vehicles, wherein said reception signal of the receiver is an echo signal from an object at a distance from a vehicle.

One or more embodiments may provide improved operation in various application areas such as, e.g.:
- integrated circuits on semiconductors: e.g., CMOS, Bipolar, BiCMOS technologies;
- radio frequency (RF) applications, e.g., microwave- and millimeter-wave applications;
- circuits including oscillators, power amplifiers and/or receivers;
- silicon ICs for radar applications (e.g., Advanced Driver Assistance Systems—ADAS in the automotive field and other industrial applications).

In an embodiment, a method comprises: applying frequency division to a local oscillator signal of a radio-frequency receiver, producing a frequency-divided signal; and generating a self-test signal of the radio-frequency receiver, the generating of the self-test signal of the radio-frequency receiver including one or more of: generating the self-test signal based on the frequency-divided signal; and monitoring generation of the self-test signal using the frequency-divided signal. In an embodiment, the method comprises: generating said local oscillator signal using a first oscillator, wherein the generating the self-test includes generating a second oscillating signal using a second oscillator, and the generating the second oscillating signal includes one or more of: controlling the second oscillator based on the frequency-divided signal; and monitoring the generation of the second oscillating signal using the frequency-divided signal. In an embodiment, the method comprises: setting frequencies of said first oscillator and said second oscillator based on a common coarse tuning signal; and fine-tuning the frequencies of said first oscillator and said second oscillator based on respective fine tuning signals. In an embodiment, one or more of the respective fine tuning signals is produced using a digital-to-analog converter. In an embodiment, the method comprises: selectively tuning a frequency of said second oscillator, producing chirp modulation of said self-test signal. In an embodiment, the method comprises: applying frequency division to said local oscillator signal (TX/LO) and said second oscillating signal to produce respective frequency-divided oscillating signals; and monitoring a frequency of said second oscillating signal, the monitoring including comparing said respective frequency-divided oscillating signals. In an embodiment, the method comprises: generating the self-test signal using a phase-locked loop (PLL) circuit having an output oscillator, an input comparator and a loop divider between said output oscillator and said input comparator; and supplying to said input comparator of the PLL circuit said frequency-divided signal. In an embodiment, the method comprises delaying the frequency-divided signal provided to said input comparator of the PLL circuit. In an embodiment, the method comprises selectively varying a division factor of said loop divider, varying a frequency of said self-test signal. In an embodiment, the method comprises: mixing the local oscillator signal with a received signal received by the radio-frequency receiver.

In an embodiment, a circuit comprises: a first frequency divider, which, in operation, frequency divides a first oscillation signal, generating a first frequency-divided signal; and self-test signal generation circuitry, which, in operation, generates a receiver self-test signal, the generating of the receiver self-test signal including one or more of: generating the self-test signal based on the first frequency-divided signal; and monitoring generation of the self-test signal using the first frequency-divided signal. In an embodiment, the circuit comprises: a first oscillator, which, in operation, generates the first oscillation signal, wherein the self-test signal generation circuitry includes a second oscillator, which, in operation, generates a second oscillation signal, and the generating the second oscillation signal includes one or more of; controlling the second oscillator based on the first frequency-divided signal; and monitoring the generation of the second oscillating signal using the first frequency-divided signal. In an embodiment, a frequency of the first oscillator is set based on a common coarse tuning signal and a first fine-tuning signal; and a frequency of the second oscillator is set based on the common coarse tuning signal and a second fine-tuning signal. In an embodiment, the circuit comprises: a digital-to-analog converter, which, in operation, generates one or both of the first fine-tuning signal and the second fine-tuning signal. In an embodiment, the self-test signal generation circuitry, in operation, selectively tunes a frequency of the second oscillator, producing chirp modulation of the self-test signal. In an embodiment, the self-test signal generation circuitry includes a second frequency divider, which, in operation frequency divides the second oscillation signal, producing a second frequency-divided signal, and the self-test signal generation circuitry, in operation, monitors the generation of self-test signal, the monitoring including comparing the first frequency-divided signal with the second frequency-divided signal. In an embodiment, the self-test signal generating circuitry includes a phase-locked loop, the phase-locked loop having: an output oscillator; an input comparator; and a loop divider coupled between the output oscillator and the input comparator, wherein the input comparator is coupled to an output of the first frequency divider. In an embodiment, the circuit comprises: a delay circuit coupled between the output of the first frequency divider and an input of the input comparator. In an embodiment, a division factor of the loop divider is adjustable and, in operation, varying the division factor of the loop divider varies a frequency of the self-test signal. In an embodiment, the circuit comprises: a mixer, which, in operation, mixes the first oscillation signal with a received radio-frequency signal.

In an embodiment, a system comprises: an input node, which, in operation, receives a frequency-divided local oscillation signal; a self-test oscillator, which, in operation, generates a self-test oscillation signal, based, at least in part, on the received frequency-divided local oscillation signal; a divider, which, in operation, divides the self-test oscillation signal; and a test-signal output node, which, in operation, outputs a receiver self-test signal based on the self-test oscillation signal. In an embodiment, the self-test oscillator is coupled to one or more of: the input node; and a control signal generated based on the received frequency-divided local oscillation signal. In an embodiment, the system comprises: a local oscillator, which, in operation, generates a local oscillation signal; and a frequency divider coupled to the local oscillator, which, in operation, receives the local oscillation signal and generates the frequency-divided local oscillation signal. In an embodiment, the system comprises: a phase-locked loop including the self-test oscillator, the divider and a comparator, wherein the comparator is coupled to the input node and to an output of the divider and the self-test oscillator is coupled to an output of the comparator. In an embodiment, the system comprises one or more of: a filter coupled between the comparator and the self-test oscillator; a delay circuit coupled between the input node and the comparator; a lock detector, which, in operation, generates a signal indicative of a lock condition of the phase-locked loop; a variable-gain amplifier coupled between the self-test oscillator and the test-signal output node; a power detector, which, in operation, generates a signal indicative of a power level of the receiver self-test signal; and control circuitry, which, in operation, generates one or more signals to control generation of the receiver self-test signal. In an embodiment, the system comprises one or more of: a frequency counter coupled to the input node and to an output of the divider, wherein the frequency counter, in operation, generates a signal indicative of a frequency of the receiver self-test signal; a variable-gain amplifier coupled between the self-test oscillator and the test-signal output node; a power detector, which, in operation, generates a signal indicative of a power level of the receiver self-test signal; and control circuitry, which, in operation, generates one or more signals to control generation of the receiver self-test signal. In an embodiment, the system comprises: a Microwave/Millimeter-wave Monolithic Integrated Circuit on a Printed Circuit Board (PCB) and at least one coupler coupling the test-signal output node to a radio-frequency receiver input node, wherein said at least one coupler: is hosted on said Printed Circuit Board externally of said Microwave/Millimeter-wave Monolithic Integrated Circuit; or is hosted internally of said Microwave/Millimeter-wave Monolithic Integrated Circuit. In an embodiment, the system comprises: a radio-frequency receiver including the local oscillator and a test signal input node coupled to the test signal output node. In an embodiment, the radio-frequency receiver is an automotive radar receiver, which, in operation, receives an echo signal from an object at a distance from a vehicle.

BRIEF DESCRIPTION OF THE SEVERAL VIEWS OF THE DRAWINGS

One or more embodiments will now be described, by way of example only, with reference to the annexed figures, wherein:

FIG. 2, including two portions designated 2A and 2B, respectively, is exemplary of possible time behaviors of certain signals in a block diagram as exemplified in FIG. 1;

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

A BIST circuit architecture may include an I/Q image rejection mixer. This architecture may be notionally able to generate a SSB (Single-Side Band) signal with characteristics adapted for the calibration of radar sensor IC. In such an arrangement image signal rejection is proportional to I/Q phase and amplitude accuracy.

For high-frequency ICs, the conventional generation of I and Q signals is complex and generally not accurate enough for an image rejection architecture.

This technical drawback limits the use of loop-back solutions for, e.g., high-frequency applications such as radar applications. A calibration procedure may improve radar sensor performance. An approach in that respect may involve measuring calibration data, e.g., using well-known RF test signals and modulation schemes and storing them in the sensor at one temperature, for instance during an end-of-line test. During sensor operation, the calibration data may be used by target detection algorithms for compensating, e.g., silicon IC process variations. Achieving good performance of a sensor can be facilitated by IC performance being as much stable as possible versus, e.g., frequency, temperature, and aging. Run-time procedures for updating calibration data may thus be helpful.

Figure 1:
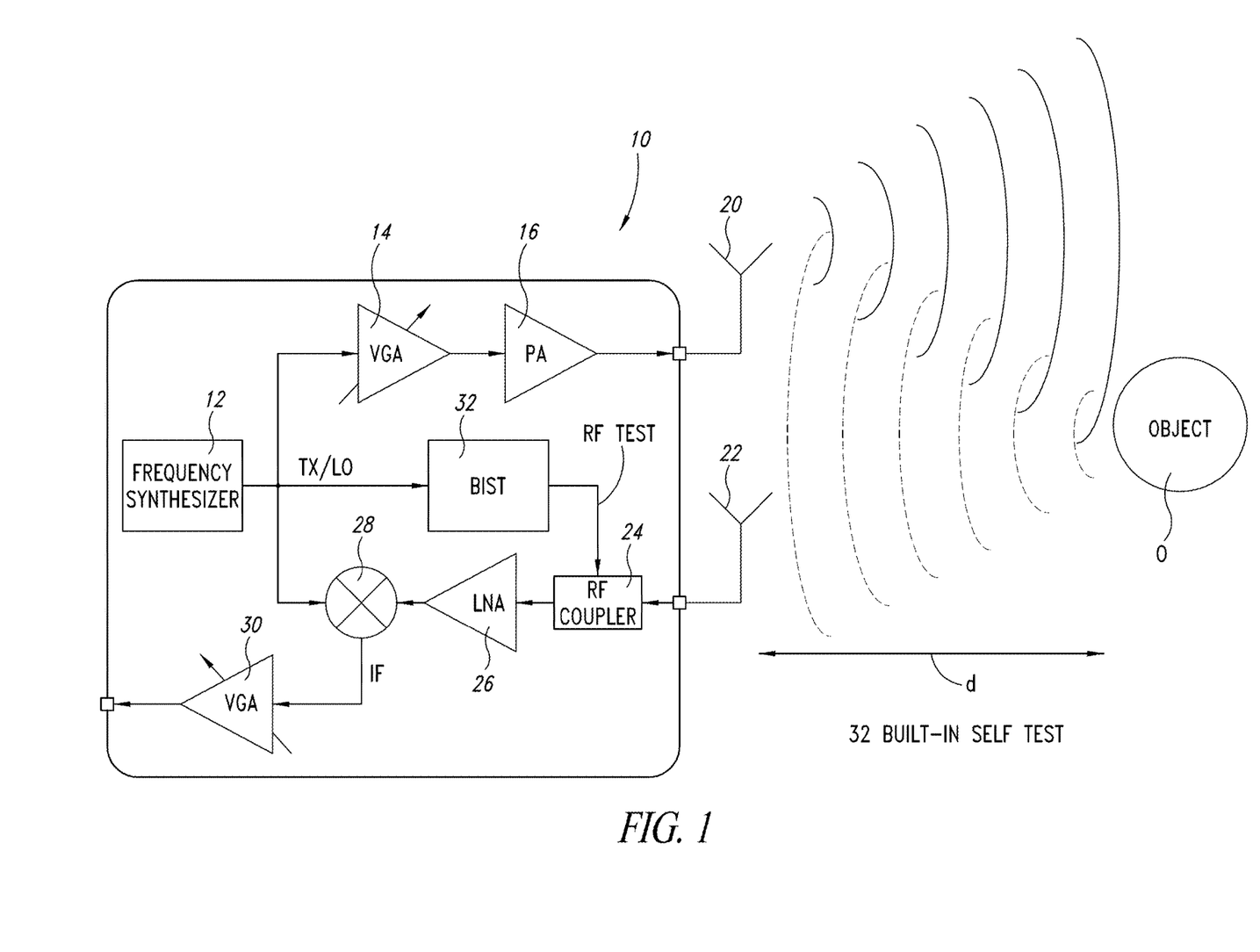
FIG. 1 is an exemplary block diagram of a radar sensor, e.g., for automotive use.

FIG. 1 shows a (simplified) exemplary block diagram of a radar sensor (e.g., including a radar sensor IC) 10 by referring to the exemplary case of an, e.g., FMCW radar sensor 10 capable of detecting an object O at a distance (range) d.

Such a sensor may include a RF frequency synthesizer 12 generating a local oscillator signal TX/LO fed to a (transmitter) variable gain amplifier (VGA) 14. The VGA may in turn feed a power amplifier (PA) 16 driving a transmission (TX) antenna 20.

A corresponding incoming (echo) signal received at a receiver (RX) antenna 22 may be fed via a RF coupler circuit 24 to a low noise amplifier (LNA) 26 and on to a mixer circuit 28 fed with the local oscillator signal TX/LO to produce a down-converted intermediate frequency (IF) signal, which in turn is fed to a (receiver) variable gain amplifier (VGA) 30.

A RF Built-In-Self-Test (BIST) block 32 may generate a RF test signal (with known characteristics) which may be fed to the high frequency stage 24 to reproduce (simulate) an echo radar signal.

Such a signal may have, e.g., the following characteristics:

Single-Side Band (SSB) signal
frequency modulation
coherence with local oscillator (TX/LO) signal
variable frequency
injection at the input of the receiver (e.g., RF coupler stage 24).

Calibration procedures applied to a circuit layout as exemplified in FIG. 1 may be able to fix both systematic and random errors as revealed by a RF test signal. Such RF test signals may thus be useful in radar sensor (e.g., radar sensor IC) auto-diagnostics and calibration procedures, e.g., with respect to hardware fault and performance improvement.

For instance, a RF test signal from the BIST block 32 in FIG. 1 may be used to simulate an echo signal from the radar sensor IC as depicted in FIG. 2: e.g., during radar sensor calibration, IC malfunction leading to unwanted spurious Doppler shifts (and thus spurious range shifts) may be detected, e.g., by analyzing the FFT of the base band IF signal generated (e.g., at 28 in FIG. 1) by injecting at the receiver input (e.g., at RF coupler 24) the (known) RF test signal $RFT_{TEST}$.

Figure 2A:
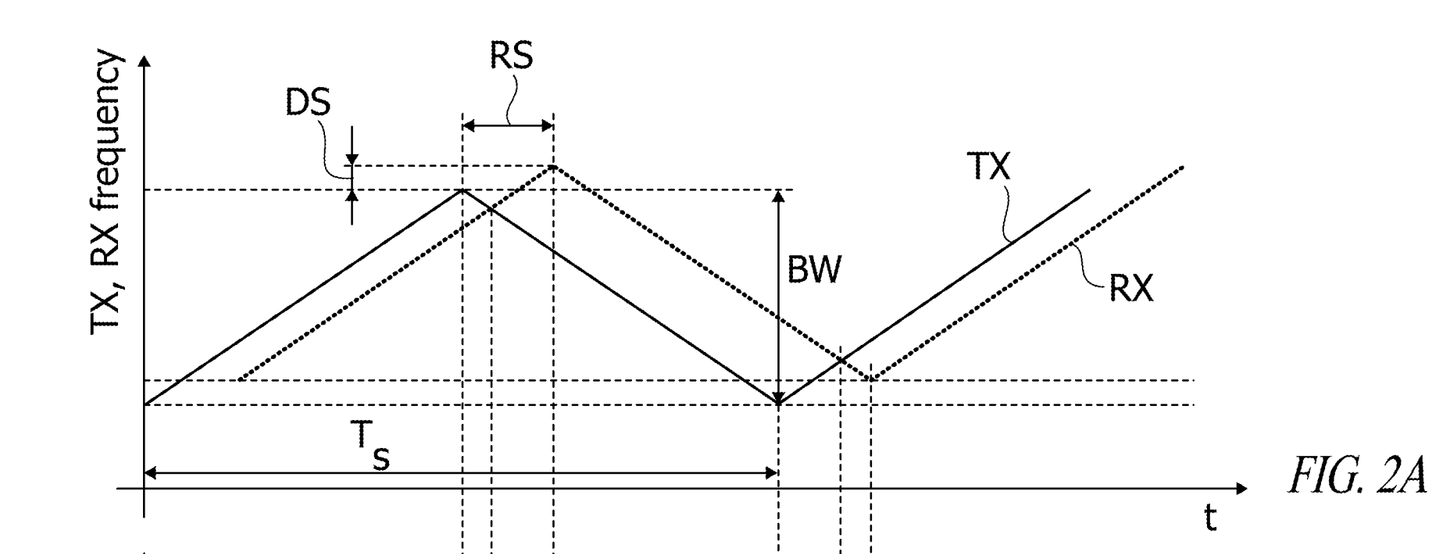

The diagrams in part 2A of FIG. 2 are exemplary of a possible behavior over time (abscissa scale) of the frequency (ordinate scale) of transmitted and received signals TX and RX varying with a (modulation) bandwidth BW over a time Ts with a Doppler shift DS and a range shift RS.

Figure 2B:
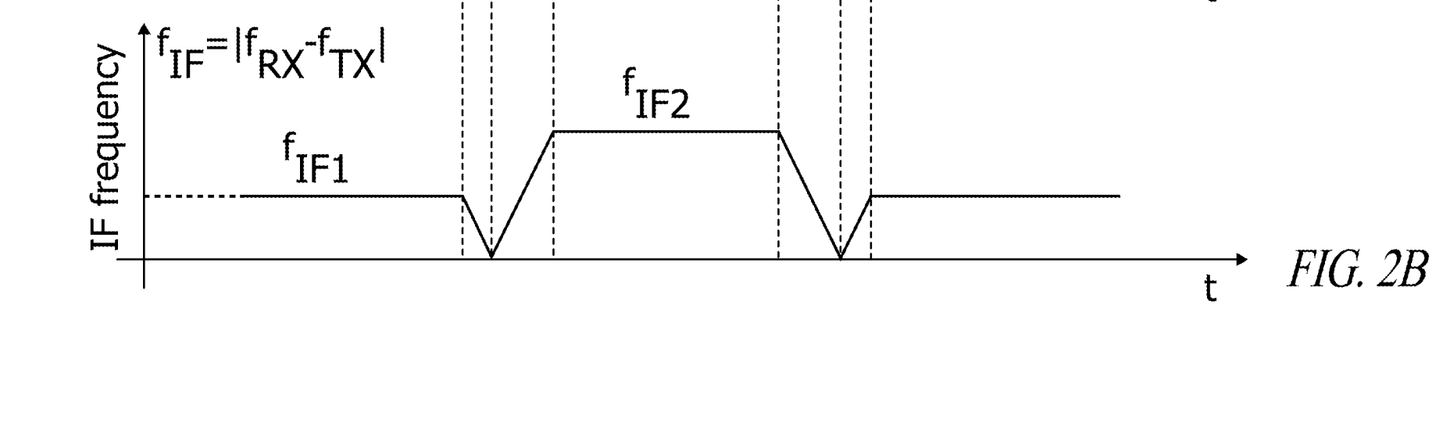

The diagram in part 2B of FIG. 2 is exemplary of a possible time behavior of a corresponding IF signal with a frequency $f_{IF}=|f_{RX}-f_{TX}|$.

Figure 3:
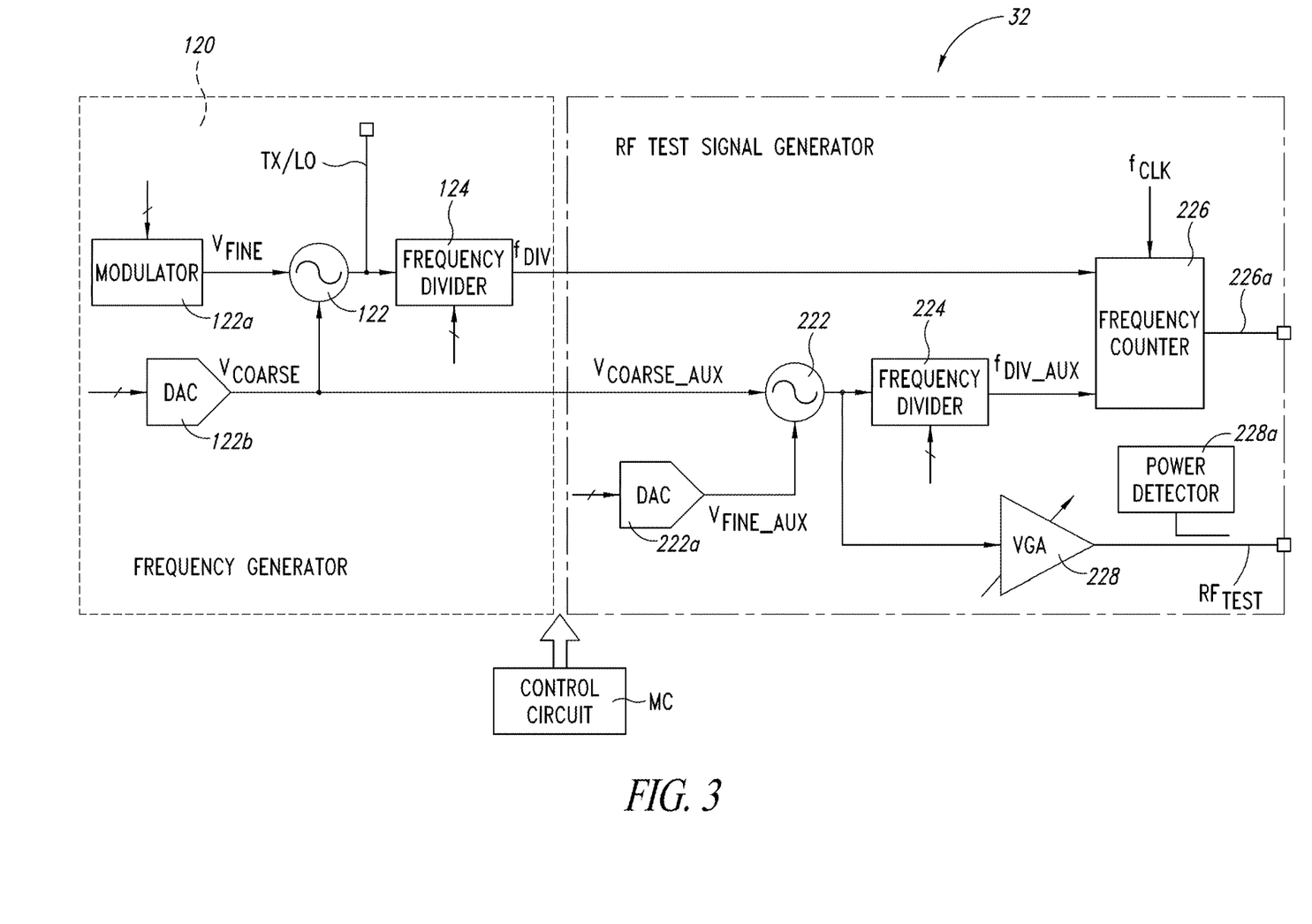
FIG. 3 is a block diagram exemplary of one or more embodiments.
Figure 4:
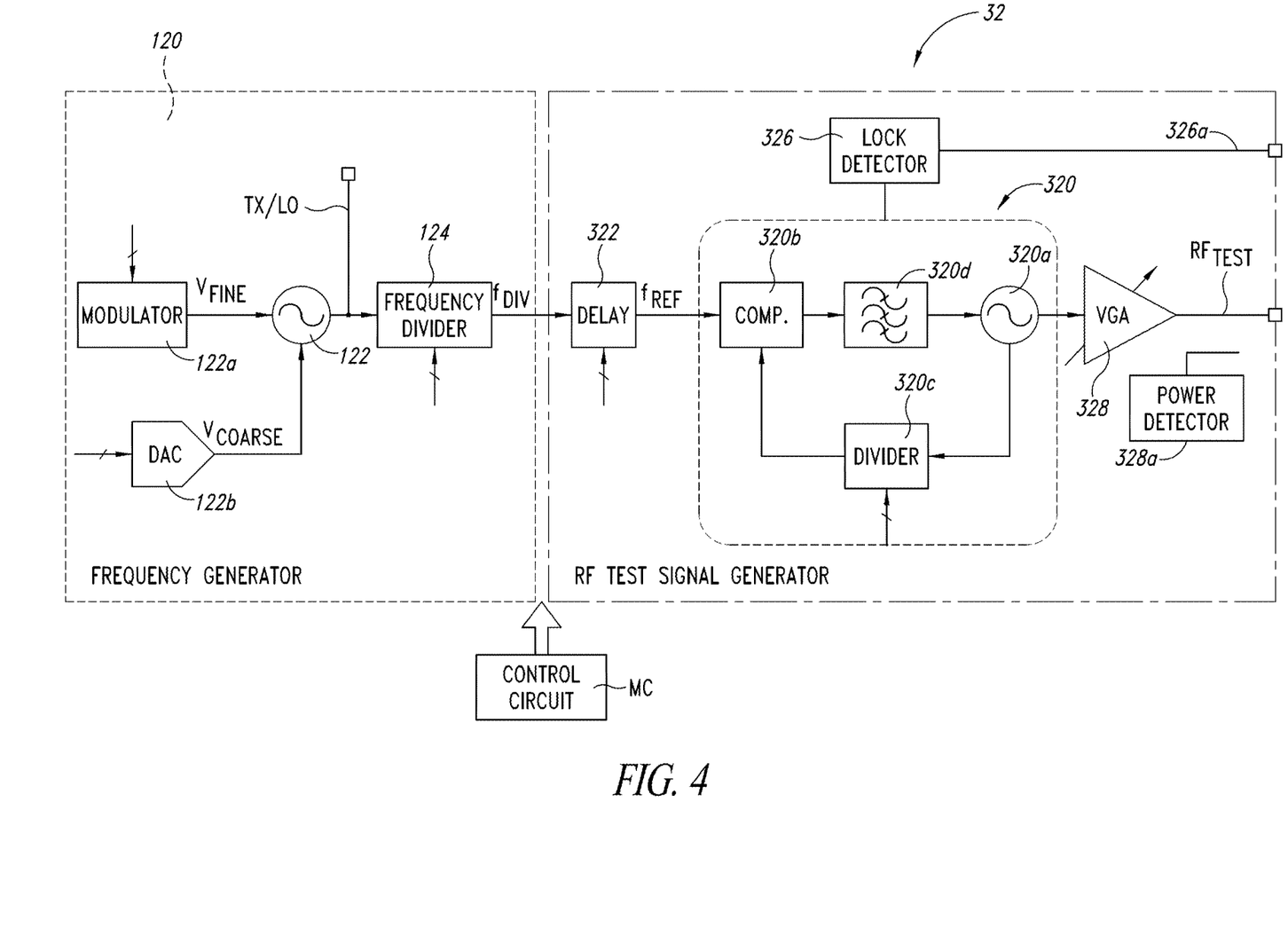
FIG. 4 is a block diagram exemplary of one or more embodiments.

In one or more embodiments, a RF test signal may be generated by resorting to the BIST architectures exemplified in FIG. 3 or FIG. 4.

In both FIGS. 3 and 4, the left-hand dashed area is exemplary of a frequency generator 120 (e.g., for a radar sensor IC).

In one or more embodiments, a simple implementation of such a generator 120 may include a voltage-controlled oscillator (VCO) 122 (see the frequency synthesizer/generator 12 in FIG. 1) and a frequency divider (:N) 124 acting on the output from the oscillator 122 to produce a frequency-divided signal $f_{DIV}$.

In one or more embodiments, the oscillation frequency of the output signal of the oscillator 122 (which may correspond to the signal TX/LO of the diagram of FIG. 1) may be controlled using a tuning signal (e.g., a voltage signal $V_{FINE}$, e.g., from a modulator 122a).

In one or more embodiments, the frequency of the output signal of the oscillator 122 may controlled by "finely tuning" with the signal $V_{FINE}$ from the modulator 122a a coarser signal $V_{COARSE}$ as derived e.g. from a digital-to-analog converter (DAC) 122b.

In one or embodiments, the modulator 122a and the DAC 122b may be external elements to an IC as exemplified herein.

In one or more embodiments a radar sensor (micro) controller circuit MC may control various components/parts of, e.g., a radar sensor IC as exemplified in the figures. In order to avoid making the graphical representation unnecessarily complex, the possible control action of the controller MC is represented in the figures as an arrow pointing into a certain component/part. For instance, the controller MC may detect (measure) the oscillation frequency from the output of the frequency divider 124 during a calibration time and produce a desired modulation scheme—e.g., chirps—as in the radar output signal.

In one or more embodiments, a frequency generator 120 as exemplified herein may include additional/more complex circuits, such as, e.g.:
  integrated modulator(s);
  an integrated DAC, e.g., to reduce the $V_{FINE}$ voltage sensitivity;
  a fully integrated N-fractional or N-integer PLL (see below).

Operation of one or more embodiments may include the above possible implementation details and may, for example, employ on two signals:
  a local oscillator signal TX/LO which may be transmitted using the power amplifier chain (see, e.g., blocks 14 and 16 in FIG. 1) and distributed for down-conversion to IF (see, e.g., the mixer 28 of FIG. 1);
  a frequency-divided signal $f_{DIV}$ as available, e.g., at the output of the divider 124.

In one or more embodiments as exemplified in FIG. 3, the frequency-divided signal $f_{DIV}$ may be used for monitoring a RF test signal generated by a (further) fine-tuned oscillator.

In one or more embodiments as exemplified in FIG. 4, the frequency-divided signal $f_{DIV}$ may be used for driving a PLL circuit including an oscillator which generates the RF test signal.

One or more embodiments may thus involve:
  applying frequency division (e.g., at 124) to a local oscillator signal (e.g., TX/LO) to produce a frequency-divided signal (e.g., $f_{DIV}$),
  providing a signal generator for generating a self-test signal $RF_{TEST}$, and
  generating the self-test signal $RF_{TEST}$ by operating a signal generator (222 in FIGS. 3—320a in FIG. 4) with operation of said generator monitored (FIG. 3) or controlled (FIG. 4) with the frequency-divided signal.

Stated otherwise, in more embodiments, generating the self-test signal $RF_{TEST}$ may involve monitoring or controlling operation of a corresponding generator based on the frequency-divided signal.

FIG. 3 shows an exemplary open-loop architecture of a RF test signal generator 32 according to one or more embodiments, wherein the frequency-divided signal $f_{DIV}$ at the output of the divider 124 is used to monitor a RF test signal generated by oscillator 222.

In one or more embodiments as exemplified in FIG. 3, the IF output signal intended to simulate target detection may be obtained by setting a frequency shift between the RF test signal $RF_{TEST}$ and the TX/LO signal by using DACs on tuning voltages.

In one or more embodiments as exemplified in FIG. 3, the first DAC 122b may provide a coarse tuning voltage $V_{COARSE}$ both to the oscillator 122 (fine tuned by means $V_{FINE}$ from the modulator 122a to provide the local oscillator signal TX/LO) and another oscillator (e.g., VCO) 222, fine tuned via a further DAC 222a.

Both oscillators 122 and 222 being (digitally) controlled by using a common DAC, that is 122b, may facilitate compensating oscillation frequency drifts due to temperature and silicon process variations.

In one or more embodiments, respective frequency dividers 124, 224 (e.g., by a same factor N) may be coupled to the outputs of the oscillators 122, 222 with the frequency-divided outputs $f_{DIV}$, $f_{DIV\_AUX}$ from the dividers 124, 224 fed to a frequency counter 226 (clocked by a clock signal $f_{CLK}$) which provides a test flag signal over a line 226a to the microcontroller MC.

In one or more embodiments, such a test flag may be generated—during a calibration phase—when both oscillators 122, 222 are oscillating at expected frequencies due to the microcontroller MC controlling the fine tuning voltage $V_{FINE\_AUX}$ of the (auxiliary) oscillator 222 via the DAC 222a while the fine tuning voltage $V_{FINE}$ of the (main) oscillator 122 may be managed by the microcontroller MC, e.g., via the modulator 122a.

In one or more embodiments, operation of the frequency counter 226 may involve comparing the frequencies of the frequency-divided $f_{DIV}$ and $f_{DIV\_AUX}$ and determining that the oscillators 122, 222 are oscillating at expected frequencies when, e.g., the ratio of the frequencies of $f_{DIV}$ and $f_{DIV\_AUX}$ reaches a certain value: in that respect it will be appreciated that $f_{DIV}$ and $f_{DIV\_AUX}$ may be generated by oscillators 122, 222 oscillating at respective frequencies such as $f_{osc}$ and $f_{osc}+f_{IF}$ and/or that the dividers 124, 224 need not necessarily have identical division factors (e.g., N).

In one or more embodiments, the oscillator 222 may be coupled to a variable gain amplifier (VGA) 228 to provide the RF test signal $RF_{TEST}$ with a level (possibly monitored with a power detector 228a) adapted to be fed to the stage 24 (see FIG. 1).

One or more embodiments as exemplified in FIG. 3 may thus exhibit one or more of the following features:

- the RF test signal $RF_{TEST}$ may be generated using an auxiliary oscillator, e.g., a VCO (222);
- the frequency shift between the RF test signal $RF_{TEST}$ and the TX/LO signal may be properly set using, e.g., DACs on the VCO tuning voltages;
- a coarse tuning voltage of both VCOs 122 and 222 may be digitally controlled using a common DAC (122b) to compensate the oscillation frequency drift due to both silicon process and temperature variations;
- the fine tuning voltage $V_{FINE\_AUX}$ of the auxiliary oscillator 222 may be digitally controlled by an additional DAC 222a while the fine tuning voltage of oscillator 122 may be managed by the microcontroller MC during the calibration phase, e.g., via the block 122a;
- the RF test signal $RF_{TEST}$ may be a continuous wave (CW) signal with its frequency $f_{RX}$ generated according to the following equation: $f_{RX}=f_{TX/LO}+f_{IF}$ where $f_{TX/LO}$ and $f_{IF}$ are the frequencies of the local oscillator signal TX/LO and the intermediate frequency signal IF, respectively;
- the difference between the oscillation frequencies of the oscillator 122 and the oscillator 222 may set the frequency $f_{IF}$ of the IF signal;
- the microcontroller MC may set the desired IF frequency by changing the fine tuning voltages of the oscillators 122, 222 through the associated (integrated) DACs;
- the accuracy in setting the IF frequency may be a function of the resolution used in controlling the fine tuning voltages $V_{FINE}$, $V_{FINE\_AUX}$ of the oscillators 122, 222;
- these fine tuning voltages may be modified by the microcontroller MC until the desired IF frequency is set with an expected accuracy and the test flag signal issued by the counter 226 on the line 226a becomes true;
- the generated RF test signal $RF_{TEST}$ may be a replica of the transmitted signal adapted to be injected to the receiver input (e.g., at 24 in FIG. 1) reproducing the echo radar signal;
- the RF test signal $RF_{TEST}$ down-converted with the TX/LO signal may generate an IF output signal, which may reproduce target detection;
- programmable frequency dividers (e.g., by a same factor N) may be used at 124, 224 to generate the frequency-divided signals $f_{DIV}$ and $f_{DIV\_AUX}$; it will be appreciated that these signals may not be identical insofar as they are generated by oscillators 122, 222 oscillating at respective frequencies such as $f_{osc}$ and $f_{osc}+f_{IF}$;
- the frequency-divided signals $f_{DIV}$ and $f_{DIV\_AUX}$ may be used by a frequency counter such as 226 to provide a test flag signal (true/false signal) on a line 226a, e.g., to the microcontroller MC when both oscillators 122, 222 are oscillating at desired frequencies with the expected accuracy;
- the power level of RF test signal $RF_{TEST}$ may be set using a variable gain amplifier (VGA), e.g., 228 which may be detected using a power detector circuit, e.g., 228a;
- both the test flag signal on line 226a and the power detector circuit 228a may facilitate making the circuit compliant with ISO26262 standard;
- the BIST circuit 32 may be disabled during the normal operation.

FIG. 4 shows an exemplary PLL-based architecture of a RF test signal generator 32 according to one or more embodiments.

In one of more embodiments a RF test signal generator 32, intended to provide a RF test signal to be applied, e.g., to the stage 24 of FIG. 1, may include a PLL (Phase Locked Loop) circuit 320, operating, e.g., by "locking" an auxiliary, e.g., voltage-controlled oscillator (VCO) 320a using as an input the frequency divided signal $f_{DIV}$ from the divider 124, possibly delayed by a (controllable) delay 322 to produce a delayed version of $f_{DIV}$ namely $f_{REF}$.

According to an otherwise conventional PLL layout, the circuit 320 may include, in addition to the oscillator 320a, an input comparator 320b which receives $f_{REF}$ and the frequency from the oscillator 320a via a PLL divider 320c. The result of the (frequency) comparison in the input comparator 320b drives the oscillator 320a via a loop filter 320d.

The PLL 320 having reached a lock condition may be detected by a lock detector 326 which may issue over a line 326a a test flag to the microcontroller MC, thus making the IC arrangement exemplified herein compliant with, e.g., the ISO26262 standard.

In one or more embodiments, the oscillator 320a in the PLL 320 may be followed by a variable gain amplifier (VGA) 328 to provide the receiver with a RF test signal having a level (possibly monitored with a power detector 328a) adapted to be fed to the stage 24 (see FIG. 1).

In one or more embodiments, the PLL divider 320c may permit to change the RF test signal frequency, e.g., by programming the PLL frequency divider 320c.

The frequency shift between the RF test signal and the local oscillator signal TX/LO may generate an IF output signal (e.g., at the output of the mixer stage 28 of FIG. 1), which simulates target detection (see, e.g., FIG. 2).

In one or more embodiments, the amplitude, frequency and phase of IF output signal may be exploited (in a manner known per se) for calibration of the radar sensor (e.g., of the radar sensor IC).

In one or more embodiments, the delay possibly applied (e.g., at 322) to the divided signal $f_{DIV}$ to produce $f_{REF}$ may permit to obtain a well-defined delay time between the RF test signal and the TX/LO signal.

In one or more embodiments, the PLL circuit 320 may follow the frequency modulation applied to the transmitted signal.

In one or more embodiments, the two oscillators (e.g., VCOs) 122 and 320a may be designed to oscillate at different frequencies to reduce any "pulling" effect (e.g., the VCO 122 may include a core oscillating at half the operating frequency and followed by a frequency doubler while the VCO 320a may be include a core oscillating at the operating frequency, or vice versa).

In one or more embodiments, the RF test signal sent to the stage 24 may be coherent with the TX/LO signal, which may facilitate simulating the transmitted signal, e.g., with the generated RF test signal exhibiting essentially the same characteristics of radar echo signal.

In one or more embodiments, the BIST circuit including the PLL block 320 may be disabled (e.g., by the controller MC) during normal operation of the radar sensor.

One or more embodiments as exemplified in FIG. 4 may thus exhibit one or more of the following features:
- generation of a RF test signal $RF_{TEST}$;
- during a self-test or calibration procedure the microcontroller MC may act (e.g., on the PLL divider 320c) to provide a desired IF frequency difference between the two oscillators (122, 320a) to generate a frequency chirp (see, e.g., the TX signal in portion 2A of FIG. 2);
- the frequency generator 120 may provide the TX/LO signal to the transmitter chain and the receiver downconverter (see, e.g., 14, 16 and 28 in FIG. 1) as well as (e.g., via the divider 124) the frequency-divided signal $f_{DIV}$ to the BIST circuit 32;
- the frequency-divided signal $f_{DIV}$ may be processed by a programmable digital delay circuit 322 to generate a well-defined delay time (see, e.g., the range shift effect in portion 2A of FIG. 2) between the RF test signal and the TX/LO signal; the PLL circuit 320 may lock the auxiliary oscillator 320a using a signal $f_{REF}$ which is a delayed replica of the frequency-divided signal $f_{DIV}$;
- the PLL circuit 320 may follow the frequency modulation applied to the TX/LO signal;
- the frequency shift between the RF test signal $RF_{TEST}$ and the TX/LO signal (see, e.g., the Doppler effect in portion 2A of FIG. 2) may be programmed via the PLL frequency divider 320c;
- the RF test signal $RF_{TEST}$ may be made coherent with TX/LO signal, which facilitates simulating the transmitted signal;
- the amplitude, frequency and phase of the IF output signal may be rendered accurate, thus facilitating radar sensor calibration;
- the oscillators 122 and 320a may be designed to oscillate at different frequencies to reduce the pulling effect.

As in the case of one or more embodiments as exemplified in FIG. 3, one or more embodiments as exemplified in FIG. 4 may exhibit one or more of the following features:
- the lock detector 326 may to provide a test flag signal (true/false signal) on a line 326a, e.g., to the microcontroller MC when the PLL circuit 320 is in a locked condition;
- the power level of RF test signal $RF_{TEST}$ may be set using a variable gain amplifier (VGA), e.g., 328, and the power level may be detected using a power detector circuit, e.g., 328a;
- both the test flag signal on line 326a and the power detector circuit 328a may facilitate making the circuit compliant with ISO26262 standard;
- the BIST circuit 32 may be disabled during normal operation.

In one or more embodiments of the BIST circuit 32 as discussed herein the resulting RF test signal $RF_{TEST}$ may have the same characteristics of echo radar signal shown.

In one or more embodiments, feeding of the RF test signal may facilitate operation of various arrangements as exemplified herein.

Figure 5:
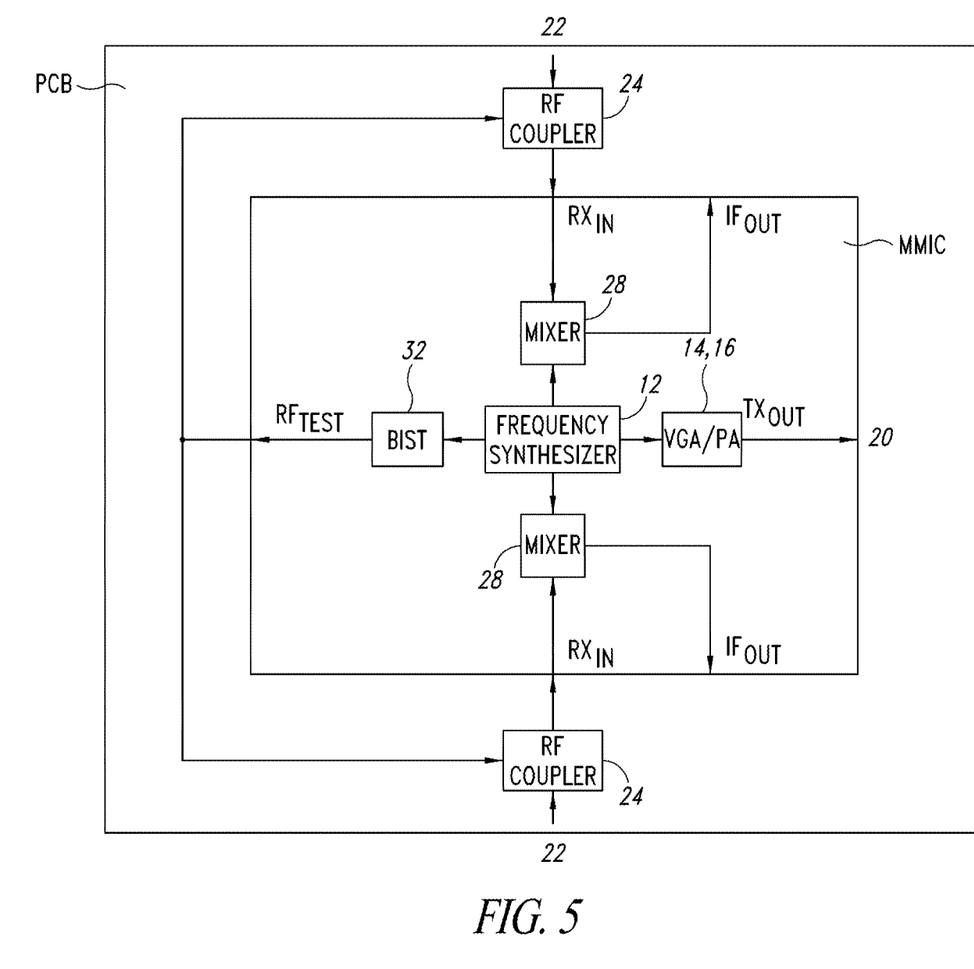
FIGS. 5 and 6 are exemplary of various circuit arrangements according to embodiments.
Figure 6:
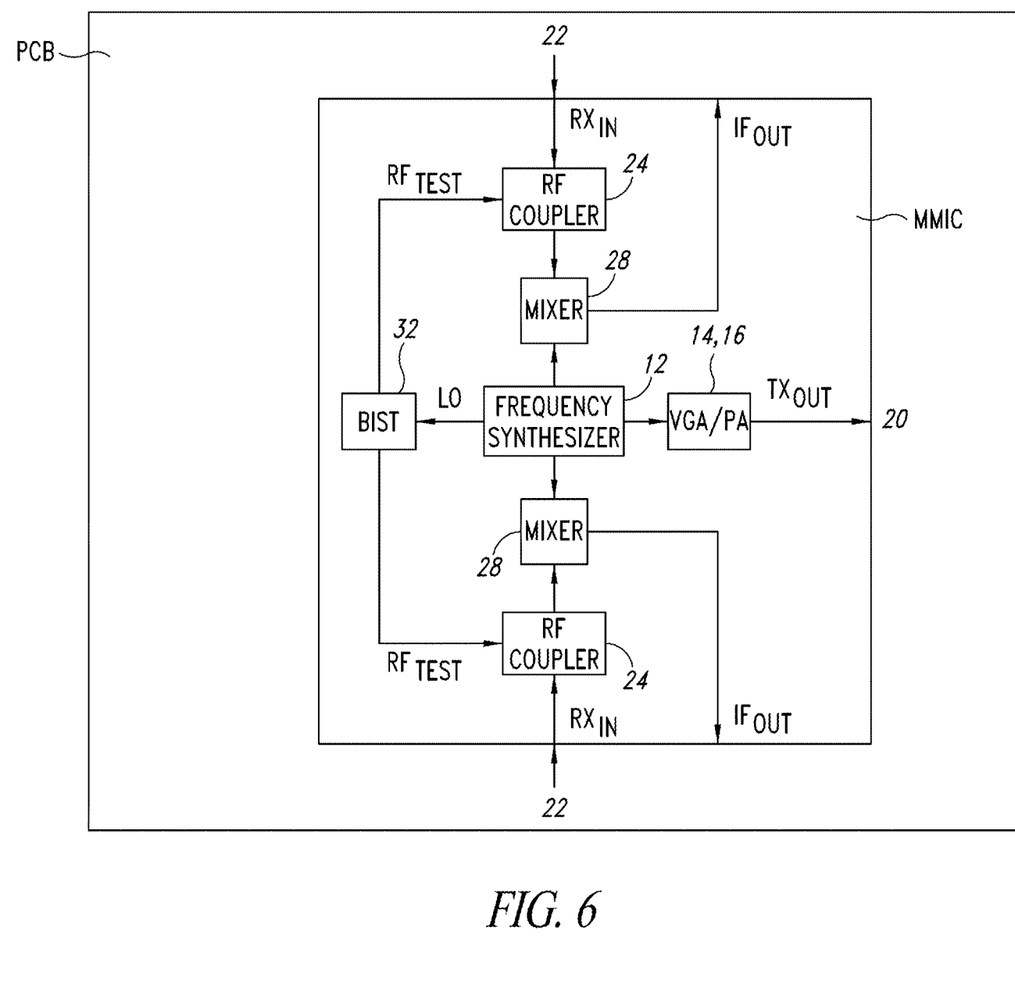

Possible arrangements of various blocks as represented in FIG. 1 are exemplified in FIGS. 5 and 6, where MIMIC and PCB are schematically indicative of a Microwave/Millimeter-wave Monolithic Integrated Circuit and a Printed Circuit Board to mount the MMIC.

The use of hybrid coupler, balun, microstrip and inductor between the output of the RF test signal generator 32 and the receiver inputs was found to influence the receiver performance.

One or more embodiments may thus exploit leakage between the RF test signal coming from the output of the VGA (228 in FIG. 3, 328 in FIG. 4) and the input(s) of the receiver 26, e.g., by using external, PCB-hosted coupling as shown in FIG. 5 or MMIC-internal coupling as shown in FIG. 6.

It will again be appreciated that reference to a radar sensor throughout this description is merely exemplary of a possible area of application of one or more embodiments. One or more embodiments may in fact find a wide variety of applications, e.g., as exemplified in the introductory portion of this description.

One or more embodiments may thus provide a method of generating a self-test signal (e.g., $RF_{TEST}$) for a receiver of radiofrequency signals (e.g., a radar sensor 10) wherein a local oscillator signal (e.g., TX/LO ) is generated (e.g., at 122) for mixing (e.g., at 28) with a reception signal (e.g., 22), the method including:
- applying frequency division (e.g., 124) to said local oscillator signal to produce a frequency-divided signal (e.g., $f_{DIV}$),
- providing a signal generator (e.g., 222 in FIG. 3 or 320a in FIG. 4) for generating said self-test signal, and
- generating said self-test signal by operating said signal generator with operation of said signal generator monitored (e.g., via the counter 226 of FIG. 3) or controlled (e.g., via the PLL circuit 320 of FIG. 4) via said frequency-divided signal.

One or more embodiments may include:
- generating said local oscillator signal via a first oscillator (e.g., 122),
- generating via a second oscillator (e.g., 222 or 320a) a further oscillating signal to provide said self-test signal with operation of said second oscillator monitored or controlled via said frequency-divided signal.

One or more embodiments may include:
- setting the frequencies of said first oscillator and said second oscillator with a common coarse tuning signal (e.g., $V_{COARSE}$), and
- finely tuning the frequencies of said first oscillator and said second oscillator with respective fine tuning signals (e.g., $V_{FINE}$, $V_{FINE\_AUX}$), at least one of said fine tuning signals ($V_{FINE}$, $V_{FINE\_AUX}$) optionally produced by means of a digital-to-analog converter (222a).

One or more embodiments may include selectively tuning (e.g., via the microcontroller MC) the frequency of said second oscillator (e.g., 222) to produce chirp modulation of said self-test signal.

One or more embodiments may include:
- applying frequency division (e.g., at 124, 224) to said local oscillator signal and said further oscillating signal to produce respective frequency-divided oscillating signals (e.g., $f_{DIV}$, $f_{DIV\_AUX}$), and
- monitoring the frequency of said further oscillating signal by comparing (e.g., via the frequency counter 226) said respective frequency-divided oscillating signals.

One or more embodiments may include:
- providing a PLL circuit (e.g., 320) with an output oscillator (e.g., 320a) for generating said self-test signal, an input comparator (e.g., 320b) and a loop divider (e.g., 320c) between said output oscillator and said input comparator,
- supplying to said input comparator of the PLL circuit said frequency-divided signal.

One or more embodiments may include supplying to said input comparator of the PLL circuit a time delayed (322, $f_{REF}$) version of said frequency-divided signal.

One or more embodiments may include selectively varying (e.g., vie the microcontroller MC) the division factor of said loop divider to vary the frequency of said self-test signal.

One or more embodiments may provide a circuit (e.g., 120, 32), including:
   a local oscillator for generating a local oscillator signal,
   at least one mixer for mixing said local oscillator signal with a reception signal,
   at least one frequency divider for applying to said local oscillator signal frequency division to produce a frequency-divided signal,
   at least one further oscillator
   the circuit configured for operating with the method of one or more embodiments and generating said self-test signal with operation of said signal generator monitored or controlled via said frequency-divided signal.

One or more embodiments may include a Microwave/Millimeter-wave Monolithic Integrated Circuit (MMIC) on a Printed Circuit Board (PCB), the circuit including at least one coupler (e.g., 24) for coupling said self-test signal to a receiver input, wherein said at least one coupler:
   is hosted on said Printed Circuit Board (PCB) externally of said Microwave/Millimeter-wave Monolithic Integrated Circuit (MMIC); or
   is hosted internally of said Microwave/Millimeter-wave Monolithic Integrated Circuit (MMIC).

One or more embodiments may provide a receiver of radiofrequency signals (e.g., a radar sensor, including a radar sensor IC) including a circuit for generating self-test signals according to one or more embodiments.

In one or more embodiments such a receiver may include a radar receiver for automotive vehicles, wherein said reception signal of the receiver is an echo signal from an object at a distance from a vehicle (see, e.g., O and d in FIG. 1).

Without prejudice to the underlying principles, the details and the embodiments may vary, even significantly, with respect to what has been described herein made by way of example, without departing from the extent of protection.

The various embodiments described above can be combined to provide further embodiments. Aspects of the embodiments can be modified, if necessary to employ concepts of the various patents, applications and publications to provide yet further embodiments.

Some embodiments may take the form of or include computer program products. For example, according to one embodiment there is provided a computer readable medium including a computer program adapted to perform one or more of the methods or functions described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some of the systems and/or modules and/or circuits and/or blocks may be implemented or provided in other manners, such as at least partially in firmware and/or hardware, including, but not limited to, one or more application-specific integrated circuits (ASICs), digital signal processors, discrete circuitry, logic gates, standard integrated circuits, state machines, look-up tables, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of testing or calibrating a radio-frequency receiver, comprising:
   generating, using a first digital-to-analog converter, a common coarse tuning signal, wherein the common coarse tuning signal is an analog voltage signal;
   generating, using a modulator, a first fine-tuning signal;
   generating a second fine-tuning signal using a second digital-to-analog converter;
   setting, using the common coarse tuning signal and the first fine-tuning signal, a first oscillation frequency of a first oscillator of the radio-frequency receiver;
   generating a local oscillator signal of the radio-frequency receiver using the first oscillator;
   applying frequency division to the local oscillator signal, producing a frequency-divided signal;
   setting, using the common coarse tuning signal, a second oscillation frequency of a second oscillator of the radio-frequency receiver, wherein the common coarse tuning signal is received by the first oscillator and the second oscillator;
   generating a radio-frequency test signal of the radio-frequency receiver using the second oscillator;
   generating, using the radio-frequency test signal and the frequency-divided signal, a self-test signal of the radio-frequency receiver and
   performing diagnostic operations on the radio-frequency receiver using the self-test signal, performing calibration operations on the radio-frequency receiver using the self-test signal, or performing diagnostic and calibration operations on the radio-frequency receiver using the self-test signal.

2. The method of claim 1, comprising:
   fine-tuning the second oscillation frequency of the second oscillator using the second fine-tuning signal.

3. The method of claim 1, comprising:
   fine-tuning the second oscillation frequency of the second oscillator using the first fine-tuning signal.

4. The method of claim 2, comprising:
   selectively fine-tuning the second oscillation frequency of the second oscillator to produce chirp modulation.

5. The method of claim 1 wherein the frequency-divided signal is a first frequency-divided signal, and the method comprises:
   applying frequency division to the radio-frequency test signal, generating a second frequency-divided signal; and
   comparing the first and second frequency-divided signals.

6. The method of claim 1, comprising:
   mixing the local oscillator signal with a received signal received by the radio-frequency receiver.

7. The method of claim 1, comprising:
   applying the radio-frequency test signal to a variable gain amplifier.

8. The method of claim 7, comprising:
monitoring a power of an output of the variable gain amplifier.

9. The method of claim 1, comprising:
setting an intermediate frequency of the radio-frequency receiver based on a difference between the first oscillation frequency of the first oscillator and the second oscillation frequency of the second oscillator.

10. A radio-frequency receiver, comprising:
a first digital-to-analog converter, which, in operation, generates a common coarse tuning signal, wherein the common coarse tuning signal is an analog voltage signal;
a modulator, which in operation, generates a first fine-tuning signal;
a second digital-to-analog converter, which, in operation, generates a second fine-tuning signal;
a first oscillator, which, in operation, generates a first oscillation signal having a first oscillation frequency that is set using the common coarse tuning signal and the first fine-tuning signal;
a first frequency divider, which, in operation, frequency divides the first oscillation signal, generating a first frequency-divided signal;
a second oscillator, which, in operation, generates a radio-frequency test signal having a second oscillation frequency that is set using the common coarse tuning signal, wherein the common coarse tuning signal is received by the first oscillator and the second oscillator; and
test circuitry, coupled to the second oscillator and the first frequency divider, which, in operation,
generates a self-test signal of the radio-frequency receiver based on the radio-frequency test signal and the first frequency-divided signal; and
performs diagnostic operations on the radio-frequency receiver using the self-test signal, performs calibration operations on the radio-frequency receiver using the self-test signal, or performs diagnostic and calibration operations on the radio-frequency receiver using the self-test signal.

11. The radio-frequency receiver of claim 10, wherein:
the second oscillation frequency is set using the common coarse tuning signal and the first fine-tuning signal.

12. The radio-frequency receiver of claim 10, wherein:
the second oscillator, in operation, receives the second fine-tuning signal; and
the second oscillation frequency is set using the common coarse tuning signal and the second fine-tuning signal.

13. The radio-frequency receiver of claim 12, comprising control circuitry, which, in operation, selectively controls the second digital-to-analog converter to generate the second fine-tuning signal to produce chirp modulation.

14. The radio-frequency receiver of claim 10, comprising:
a second frequency divider coupled between the second oscillator and the test circuitry, which, in operation, frequency divides the radio-frequency test signal, producing a second frequency-divided signal, wherein the test circuitry, in operation, compares the first frequency-divided signal with the second frequency-divided signal.

15. A system, comprising:
an antenna circuit;
a first digital-to-analog converter, which, in operation, generates a common coarse tuning signal, wherein the common coarse tuning signal is an analog voltage signal;
a modulator, which in operation, generates a first fine-tuning signal;
a second digital-to-analog converter, which, in operation, generates a second fine-tuning signal;
a first oscillator, which, in operation, generates a first oscillation signal having a first oscillation frequency that is set using the common coarse tuning signal and the first fine-tuning signal;
a mixer coupled to the first oscillator and to the antenna circuit, wherein the mixer, in operation, generates an intermediate frequency signal;
a first frequency divider, which, in operation, frequency divides the first oscillation signal, generating a first frequency-divided signal;
a second oscillator, which, in operation, generates a radio-frequency test signal having a second oscillation frequency that is set using the common coarse tuning signal, wherein the common coarse tuning signal is received by the first oscillator and the second oscillator; and
test circuitry, coupled to the second oscillator and the first frequency divider, which, in a test mode of operation,
generates a self-test signal based on the radio-frequency test signal and the first frequency-divided signal; and
performs diagnostic operations on the system using the self-test signal, performs calibration operations on the system using the self-test signal, or performs diagnostic and calibration operations on the system using the self-test signal.

16. The system of claim 15, comprising an automotive radar sensor integrated circuit including the first oscillator and the first frequency divider.

17. The system of claim 16, wherein the automotive radar sensor integrated circuit includes the second oscillator and the test circuitry.

* * * * *